United States Patent
Yoda et al.

(10) Patent No.: US 7,521,797 B2
(45) Date of Patent: Apr. 21, 2009

(54) METHOD OF MANUFACTURING SUBSTRATE JOINT BODY, SUBSTRATE JOINT BODY AND ELECTROOPTICAL DEVICE

(75) Inventors: Tsuyoshi Yoda, Nagano (JP); Suguru Akagawa, Nagano (JP)

(73) Assignee: Seiko Epson Corporation (JP)

( * ) Notice: Subject to any disclaimer, the term of this patent is extended or adjusted under 35 U.S.C. 154(b) by 409 days.

(21) Appl. No.: 11/074,351

(22) Filed: Mar. 7, 2005

(65) Prior Publication Data

US 2005/0205992 A1    Sep. 22, 2005

(30) Foreign Application Priority Data

Mar. 18, 2004    (JP)    ............................. 2004-078284

(51) Int. Cl.
*H01L 23/48* (2006.01)

(52) U.S. Cl. ................ 257/737; 257/738; 257/773; 257/776; 257/778; 257/783; 257/786; 257/E23.02; 257/E23.021; 438/613; 438/614; 438/615; 438/616; 438/617

(58) Field of Classification Search ......... 257/772–795, 257/E21.503, E21.511, 664, 665, 734–786, 257/E29.111–E29.165, E23.01–E23.079, 257/E23.141–E23.179, E21.135–E21.21, 257/E21.627, E21.641, 737, 738; 438/571, 438/597, 666, 612–617; 228/180.22

See application file for complete search history.

(56) References Cited

U.S. PATENT DOCUMENTS

| | | | | | |
|---|---|---|---|---|---|
| 5,394,490 | A | * | 2/1995 | Kato et al. | 385/14 |
| 5,629,566 | A | * | 5/1997 | Doi et al. | 257/789 |
| 5,656,858 | A | * | 8/1997 | Kondo et al. | 257/737 |
| 5,805,865 | A | * | 9/1998 | Mimura et al. | 703/28 |
| 6,337,265 | B1 | * | 1/2002 | Trezza et al. | 438/612 |
| 6,858,943 | B1 | * | 2/2005 | Peterson et al. | 257/784 |
| 7,159,309 | B2 | * | 1/2007 | Yamamoto et al. | 29/832 |
| 2006/0255474 | A1 | * | 11/2006 | Ahmad et al. | 257/778 |

FOREIGN PATENT DOCUMENTS

| | | |
|---|---|---|
| JP | 64-035528 | 2/1989 |
| JP | 02-066953 | 3/1990 |
| JP | 05-218137 | 8/1993 |
| JP | 05-218280 | 8/1993 |
| JP | 10-74799 A | 3/1998 |
| JP | 2003-031778 | 1/2003 |

* cited by examiner

*Primary Examiner*—Jasmine J Clark
(74) *Attorney, Agent, or Firm*—Harness, Dickey & Pierce, P.L.C.

(57) ABSTRACT

A method of manufacturing a substrate joint body by mounting a TFT on a wiring substrate includes a step of arranging an electrode pad of the wiring substrate and an electrode pad of the TFT at a predetermined interval and mechanically coupling the wiring substrate and the TFT with a adhesive and a step of electrically coupling the wiring substrate and the TFT by growing a bump from the electrode pad of the wiring substrate and/or the electrode pad of the TFT.

10 Claims, 6 Drawing Sheets

METHOD OF MANUFACTURING SUBSTRATE JOINT BODY, SUBSTRATE JOINT BODY AND ELECTROOPTICAL DEVICE

RELATED APPLICATIONS

This application claims priority to Japanese Patent Application No. 2004-078284 filed Mar. 18, 2004 which is hereby expressly incorporated by reference herein in its entirety.

BACKGROUND

1. Technical Field

The present invention relates to a method of manufacturing a substrate joint body, a substrate joint body and an electrooptical device.

2. Related Art

It is sometimes preferred that a plastic substrate is used as a base substrate for a general semiconductor applied device such as a liquid-crystal display device and an organic electroluminescence (hereinafter, "EL") device for reasons such as that it can be manufactured at a low cost and it can prevent the device form being broken when it is deformed or dropped.

However, a thin film transistor (hereinafter "TFT") used in a panel-type display device is manufactured through a high-temperature manufacturing process. When the TFT is formed on the plastic substrate through the high-temperature manufacturing process or when a circuit element such as an organic EL is formed through the high-temperature manufacturing process, the substrate can be deformed by heat, the circuit element could be destroyed and an element life could be shortened. In this way, a desired semiconductor applied device could not be manufactured.

A transfer technique to form the semiconductor applied device has been recently proposed (for example, see Japanese Unexamined Patent Publication No. 2003-031778). In the transfer technique as shown in FIG. 20, after a TFT 101 is formed on a heat-resisting base substrate 102 by a commonly used semiconductor manufacturing technique including the high-temperature process, an element forming film (layer) in which the TFT 101 is formed is separated from the base substrate 102. Then, this separated film is applied to a wiring substrate 103 comprising the plastic substrate and the like. Such a transfer technique makes it possible to form circuit elements without exposing the plastic substrate and the circuit elements such as the organic EL element to the high-temperature process. This means that it is possible to prevent the substrate from being deformed by heat or to prevent the circuit elements from being destroyed and a fine semiconductor applied device can be provided.

As one way to couple a wiring pattern 104 in the substrate to the TFT 101 by using the above-mentioned transfer technique, it is proposed that the wiring pattern 104 is coupled to the TFT 101 through a bump 105 formed above the wiring pattern 104 and through conductive particles 106.

Moreover, as a method of forming the above-mentioned bump 105, plating, studs and the like can be used. Plating is often adopted since it is possible to form the bump 105 in a micron-order area and shorten a takt time. In addition, it excels in height uniformity. Furthermore, there are electrolytic plating and electroless plating processes. Electroless plating is preferable since it eliminates a step of forming a base electrode and a photolithography process, and also it is possible to shorten the takt time and lower the production cost.

In the above-described transfer technique, when accuracy of the height of the bump 105 suffers, printing precision of the conductive particles 106 (discharge rate, shape and a accuracy of position) lowers and/or a trapping or capturing rate of the conductive particles 106 is low, or when the substrate is warped by the heat and pressure at the time of the transfer, poor electrical contacts may occur because the electric continuity of the TFT 101 cannot be secured. When the heat and pressure at the time of the transfer are raised to reduce the potential for poor electrical contacts to occur, the TFT 101 could be damaged and destroyed.

The present invention has been developed in consideration of the above-mentioned problems, and is intended to provide a method of manufacturing a substrate joint body with which conduction between an element and a wiring substrate can be securely obtained without damaging or destroying the element. The present invention is also intended to provide a substrate joint body and an electrooptical device.

SUMMARY

In order to solve the above-mentioned problems, the present invention adopts the following features.

A method of manufacturing a substrate joint body by mounting an electric element on a wiring substrate according to the present invention includes a step of arranging an electrode pad of the wiring substrate and an electrode pad of the electric element at a predetermined interval and mechanically coupling the wiring substrate and the electric element and a step of electrically coupling the wiring substrate and the electric element by growing a bump from the electrode pad of the wiring substrate and/or the electrode pad of the electric element.

In this way, even if the accuracy of the bonding is poor such that the bonding position of the electric element and the wiring substrate is slanted by a warp or step of the substrate and intervals between the electrode pads become non-uniform, these electrode pads can be certainly electrically coupled by sufficiently growing the bump between the electrode pads.

Therefore, the conduction between the electric element and the wiring substrate can be securely obtained without having trouble such as damaging or destroying the electric element when the heat and pressure are raised in order to couple them.

In the method of manufacturing a substrate joint body, the wiring substrate and the electric element may be mechanically coupled by applying an adhesive containing a spacer with a predetermined size between the wiring substrate and the electric element.

In this way, even if a different amount of heat and pressure is applied to each electric element and the wiring substrate, both the electrode pad of the electric element and the electrode pad of the wiring substrate can be arranged at a predetermined interval. And the electrode pads are credibly electrically coupled by growing the bump between the electrode pads.

In the method of manufacturing a substrate joint body, the adhesive may be applied such that the adhesive is prevented from spreading to the electrode pad when the electrode pad of the wiring substrate and the electrode pad of the electric element are arranged at the predetermined interval.

In this way, the adhesive is placed such that it does not flow and spread to the electrode pad. This helps the bump credibly grow in the space between the electrode pads and the electrode pads can be electrically coupled to each other.

In the method of manufacturing a substrate joint body, the bump may be grown by electroless plating when the wiring substrate and the electric element are electrically coupled.

In this way, the metal plating is deposited on the electrode pad by electroless plating and made to grow as the bump. Therefore, the electrode pads can be securely electrically coupled through the bump.

In the method of manufacturing a substrate joint body, the electrode pad of the wiring substrate and the electrode pad of the electric element may be formed so as to have a size with which the bump is securely placed adjacent to the electrode pads without causing a short when the wiring substrate and the electric element are electrically coupled.

In this way, a short caused by the bump growing between the electrode pads will be prevented and trouble caused by the short can be assuredly prevented.

The method of manufacturing a substrate joint body may further include a step of filling a sealant between the wiring substrate and the electric element after the wiring substrate and the electric element are electrically coupled.

In this way, the coupling position of the electrode pads through the grown bump can be steadily protected by the sealant and the reliability of the connection can be enhanced.

A substrate joint body of the present invention is manufactured by the above-described method of manufacturing a substrate joint body.

In this way, even if the accuracy of the bonding is poor such that the bonding position of the electric element and the wiring substrate is slanted by a warp or step of the substrate and intervals between the electrode pads become non-uniform, these electrode pads can be certainly electrically coupled by sufficiently growing the bump between the electrode pads.

Therefore, the conduction between the electric element and the wiring substrate can be securely obtained without having trouble such as damaging or destroying the electric element when the heat and pressure are raised in order to couple them.

In the substrate joint body, the electrode pads may be annularly arranged so as to surround the mechanical coupling part of the wiring substrate and the electric element.

In this way, a large amount of the adhesive can be applied in the center and high adhesion can be secured when the electric element is transferred to the wiring substrate. Moreover, the adhesive can be printed in a large area even by a printing method which is difficult to transfer in a minute area. Furthermore, the electrode pads placed in the periphery of the mechanical connection part of the adhesive can be certainly contacted with the plating solution and the electric connection by electroless plating can be secured.

An electrooptical device of the present invention having a switching element that drives a light emitting element and is mounted on a wiring substrate includes an electrode pad of the wiring substrate and an electrode pad of the switching element arranged at a predetermined interval and a bump grown from the electrode pad of the wiring substrate and/or the electrode pad of the switching element, wherein the wiring substrate and the switching element are mechanically coupled and the wiring substrate and the switching element are electrically coupled through the bump.

In this way, even if the accuracy of the bonding is poor such that the bonding position of the electric element and the wiring substrate is slanted by a warp or step of the substrate and intervals between the electrode pads become non-uniform, these electrode pads can be certainly electrically coupled by sufficiently growing the bump between the electrode pads.

Therefore, the conduction between the electric element and the wiring substrate can be securely obtained without having trouble such as damaging or destroying the electric element when the heat and pressure are raised in order to couple them.

DETAILED DESCRIPTION

A wiring substrate, a method of manufacturing a wiring substrate, a substrate joint body, a method of manufacturing a substrate joint body and an electrooptical device of the present invention will now be described in detail with reference to the accompanying drawings.

Figure 1:
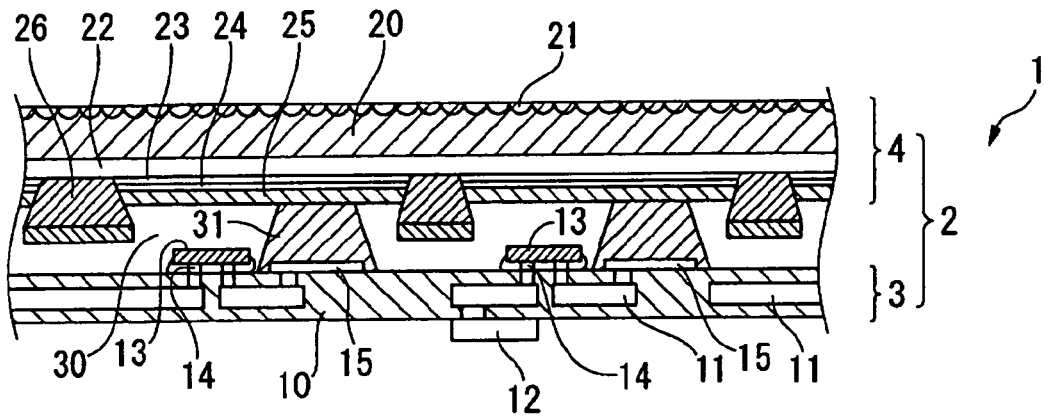
FIG. 1 is a sectional view showing a schematic structure of a substrate joint body and an electrooptical device of the present invention.
Figure 15:
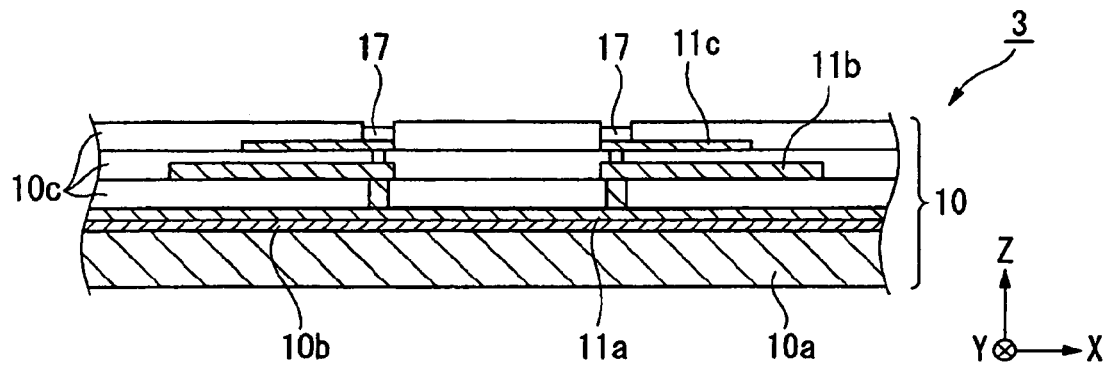
FIG. 15 is a sectional view showing a wiring substrate of the present invention.
Figure 16:
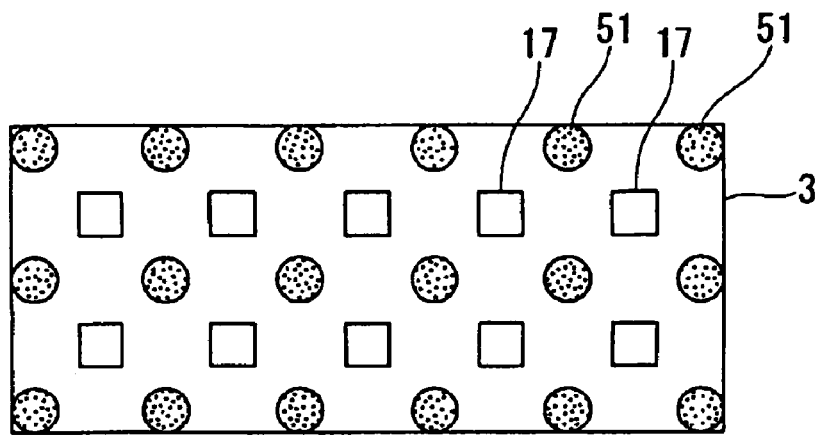
FIG. 16 is a plan view showing a substantial part of the wiring substrate of the present invention.
Figure 17:
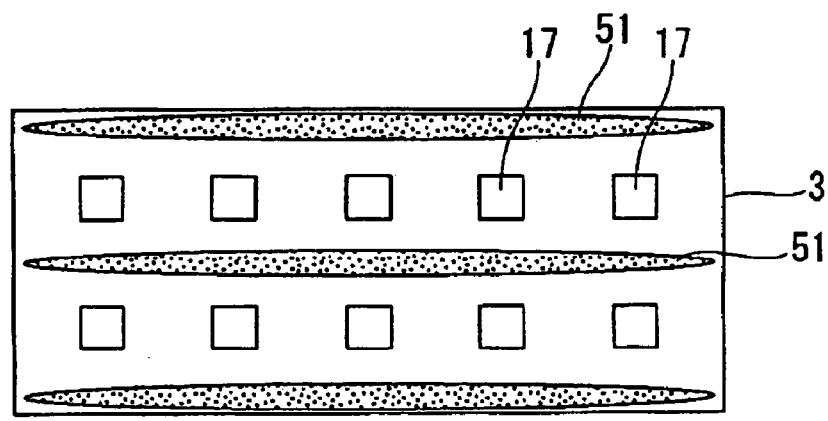
FIG. 17 is a plan view showing a substantial part of the wiring substrate of the present invention.

FIG. 1 is a sectional view showing a schematic structure of the substrate joint body and the electrooptical device. FIGS. 2 through 14 are explanatory drawings explaining the manufacturing processes of the substrate joint body and the electrooptical device. FIG. 15 is an enlarged sectional view to describe the wiring substrate. FIG. 16 and FIG. 17 are plan views showing the wiring substrate of the present invention.

In the figures that appear in the following description, a scale size of each member may be changed in order to make each member recognizable.

Electrooptical Device and Substrate Joint Body

As shown in FIG. 1, an electrooptical device 1 at least has a substrate joint body 2. The substrate joint body 2 has a wiring substrate 3 and an organic EL substrate 4 (light emitting element substrate). The wiring substrate 3 and the organic EL substrate 4 are joined together in a bonding process and a transfer process which are described later.

The wiring substrate 3 includes a multilayer substrate 10, a wiring pattern 11 having a certain shape and formed on the multilayer substrate 10, a circuit part 12 coupled with the wiring pattern 11 and a TFT 13 (electric element) that drives an organic EL element 24. The wiring substrate 3 further includes a TFT connection part 14 that couples the TFT 13 to the wiring pattern 11 and an organic EL connection part 15 that couples the organic EL element 24 to the wiring pattern 11.

Here, the connection part 14 is formed according to a terminal pattern of the TFT 13 and includes a bump 14a formed by an electroless plating which will be described later.

The EL substrate 4 includes a transparent substrate 20 that transmits an emitted light, a light scattering part 21 that scatters the emitted light and an anode 22 made of a transparent metal such as indium tin oxide (ITO). The EL substrate 4 further includes a hole injection/transport layer 23, the organic EL element 24, a cathode 25 and a cathode separator 26. Here, the anode 22, the hole injection/transport layer 23, the organic EL element 24 and the cathode 25 are so-called luminescent function elements that produce luminescence by providing electron holes and electrons to the organic EL element 24. The detailed structure of such luminescent function elements is described in documents that have been publicly disclosed. An electron injection/transport layer may be formed between the organic EL element 24 and the cathode 25.

Moreover, a sealing paste 30 is filled in a space between the wiring substrate 3 and the EL substrate 4, and a conductive paste 31 is also provided in order to electrically couple the organic EL connection part 15 with the cathode 25.

Though a case where the organic EL substrate is employed as the light emitting element substrate will be described in this embodiment, it is not limited to this case. For example, a light emitting element substrate having a solid light emitting element such as a light-emitting diode (LED) may be adopted.

Method of Manufacturing an Electrooptical Device and a Substrate Joint Body

Next, a method of manufacturing the electrooptical device 1 and the substrate joint body 2 shown in FIG. 1 will be described with reference to FIGS. 2 through 9.

Method of Manufacturing the Base Substrate

First, a step of forming the TFT on a base substrate 40 is described with reference to FIG. 2. The step is performed before the TFT 13 is joined and transferred to the wiring substrate 3.

A commonly used technique including a high-temperature process may be applied to manufacture the TFT 13 and a description of the forming process of the TFT 13 is omitted here. The base substrate 40 and a separation layer 41 are described in detail below.

The base substrate 40 is not a structure member of the electrooptical device 1 but only used in the TFT manufacturing process and the jointing and transferring process. To be more specific, a transparent heat-resistant substrate such as quartz glass that is tolerant of about 1000° C. is preferable as the base substrate 40. Besides quartz glass, heat-resistant glass such as soda glass, Corning 7059 and Nippon Electric Glass OA-2 can be used.

A thickness of the base substrate is not especially limited but it is preferably set to be about 0.1-0.5 mm, more particularly about 0.5-1.5 mm. This is because the strength of the substrate is decreased when the base substrate is too thin while a light transmissivity of the substrate reduces and irradiated light is attenuated when the substrate is too thick and the light transmissivity of the substrate is low. When the light transmissivity of the substrate is high, the substrate can be thicker than the above-mentioned upper limit.

The separation layer 41 is made of a material with which separation (also called "stratal separation" or "boundary separation") occurs within the layer or at the interface by irradiating light such as a laser beam. In other words, when the material is irradiated with a light having certain intensity, an interatomic bond of the atomic elements composing the material or an intermolecular bond of the molecules composing the material is broken or decreased. Then, ablation and the like happens and separation occurs. There are two different ways to perform the separation process. One is that an element contained in the separation layer 41 is turned into a gas and then the separation occurs when the gas is released. The other is that the separation layer 41 absorbs the light and becomes a vapor and then the separation occurs when the vapor is released.

As a constituent of the separation layer 41, for example, amorphous silicon (a-Si) is used and hydrogen (H) may be contained in the amorphous silicon. The hydrogen contained in the separation layer is released by the light irradiation and an inner pressure is produced in the separation layer 41. This promotes the separation so that it is preferred that the amorphous silicon contains hydrogen. In this case, the hydrogen content is preferably set to be more than about 2 at %, more particularly 2-20 at %. The hydrogen content can be adjusted by changing a film forming condition. For example, when chemical vapor deposition (CVD) is adopted to form the film, conditions such as a gas composition, a gas pressure, a gas atmosphere, a gas flow rate, a gas temperature, a substrate temperature and an amount of power put in can be used to adjust the hydrogen content. As other materials for the separation layer, silicon oxide or silicate compound, nitride ceramics such as silicon nitride, aluminum nitride and titanium nitride, organic polymeric material (their interatomic bonds should be breakable with exposure of the light), metal such as Al, Li, Ti, Mn, In, Sn, Y, La, Ce, Nd, Pr, Gd and Sm or alloyed metal including at least one of these metals can be used.

A thickness of the separation layer 41 is preferably set to be about 1 nm-20 µm, particularly about 10 nm-2 µm, and more preferably 20 nm-1 µm. This is because the separation layer cannot be uniformly formed and the separation will be unevenly performed when the separation layer 41 is too thin. When the separation layer 41 is too thick, it is necessary to enhance the power (light intensity) of the irradiating light to cause the separation and it could takes more time to remove a residue of the separation layer 41 remaining after the separation.

Any method can be applied to form the separation layer 41 as long as the separation layer 41 can be formed with a uniform thickness. The particular method chosen will be according to conditions such as composition and the thickness of the separation layer 41. For example, various vapor deposition methods such as CVD (including MOCVD (metal-organic CVD), low pressure CVD and Electron Cyclotron Resonance CVD (ECR-CVD)), deposition, molecular beam deposition (MB), sputtering, ion-doping, physical vapor deposition (PVD) and the like can be applied. Various plating methods such as electroplating, dipping and electroless plating, various application methods such as Langmuir-Blodgett (LB) method, spin coat method, spray coat method and roll coat method, various printing methods, transfer method, ink-jet method, powder jet method and the like can also be adopted. More than one method out of the above-mentioned methods or others may be combined to form the separation layer.

When the separation layer 41 is made of amorphous silicon (a-Si), the CVD method, more particularly, the low pressure CVD or the plasma CVD is preferably used to form the separation layer. When the separation layer 41 is formed by the sol-gel method using ceramic or when the separation layer 41 is made of organic polymeric material, the application method, more particularly, the spin coat method is preferably applied.

Method of Manufacturing a Wiring Substrate

Figure 2:
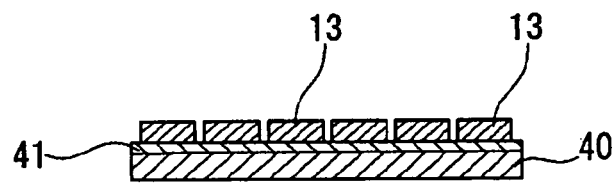
FIGS. 2 through 14 are explanatory drawings explaining manufacturing processes of the substrate joint body and the electrooptical device of the present invention.
Figure 3:
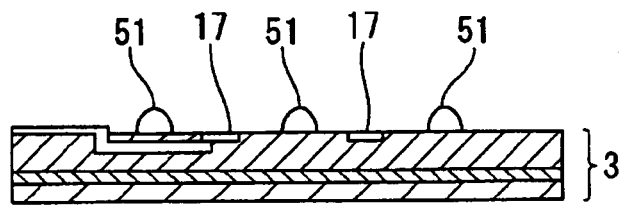

A manufacturing process of the wiring substrate 3 (method of manufacturing the wiring substrate) shown in FIG. 3 is performed while manufacturing the base substrate 40 shown in FIG. 2.

Here, the manufacturing process of the wiring substrate 3 shown in FIG. 3 will be described in detail with reference to FIG. 15. FIG. 15 is an enlarged sectional view for describing the wiring substrate 3.

First, an oxide silicon film 10b (SiO$_2$) is formed on a surface of a glass substrate 10a by a CVD (chemical vapor deposition) method as shown in FIG. 15. A thickness of the oxide silicon film 10b is preferably about 200 nm.

Then, a first wiring pattern 11a is formed on the oxide silicon film lob. The first wiring pattern 11a preferably has a multilayer structure. A three-layer structure composed of titanium, aluminum-copper alloy and titanium nitride (Ti/AlCu/TiN) is employed in this embodiment. The thicknesses of these films are preferably set to be respectively about 20 nm, 300 nm and 100 nm.

Then, a resin insulating film 10c is formed on the first wiring pattern 11a. The resin insulating film 10c is preferably made of acrylic resin and its thickness is preferably about 2600 nm.

Next, a second wiring pattern 11b is formed on the resin insulating film 10c. The second wiring pattern 11b preferably has a multilayer structure. In this embodiment, the second wiring pattern 11b has a four-layer structure composed of titanium, titanium nitride, aluminum-copper alloy (2% copper content) and titanium nitride (Ti/TiN/Al 2% Cu/H—TiN). It is preferred that the thicknesses of these films are respectively about 20 nm, 50 nm, 1600 nm and 50 nm.

Then, the resin insulating film 10c is formed on the second wiring pattern 11b. The resin insulating film 10c is made of the above-mentioned material and has the above-mentioned thickness.

Next, a third wiring pattern 11c is formed on the resin insulating film 10c. The third wiring pattern 11c preferably has a multilayer structure. In this embodiment, the third wiring pattern 11c has a three-layer structure composed of titanium, titanium nitride and aluminum-copper alloy (Ti/TiN/AlCu). It is preferred that thicknesses of these films are respectively about 20 nm, 50 nm and 100-1000 nm.

Then, the resin insulating film 10c is formed on the third wiring pattern 11c. The resin insulating film 10c is made of the above-mentioned material and has the above-mentioned thickness.

As described above, the multilayer substrate 10 shown in FIG. 1 is formed by forming the oxide silicon film 10b, the three resin insulating films 10c and the three wiring patterns 11a, 11b and 11c on top of one another on the glass substrate 10a.

Moreover, the third wiring pattern 11c is exposed by removing a part of the resin insulating film 10c formed in the third layer and the exposed portion becomes an electrode pad 17 which is an aluminum (Al) pad for forming a plating in a later process.

Though the three wring patterns are formed in this embodiment, two wring patterns may also be adopted.

Transfer Process of TFT

Next, a method of joining the above-described wiring substrate 3 and the base substrate 40 and transferring the TFT to the wiring substrate 3 will be described with reference to FIGS. 3 though 14.

Here, though various conventional techniques can be applied to transfer the TFT, Surface Free Technology by Laser Ablation (SUFTLA) (registered trademark) is especially used to perform the transfer process in this embodiment.

Figure 4:
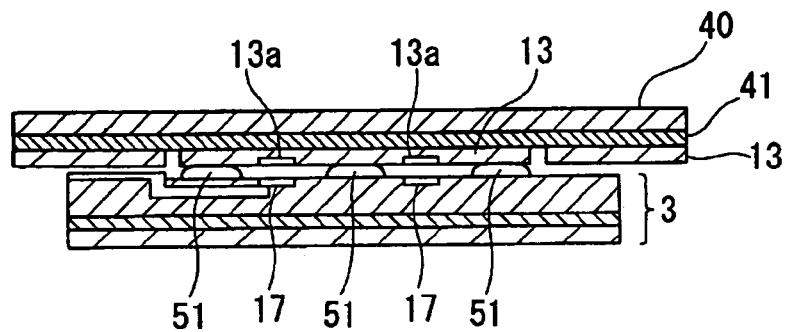

An adhesive 51 is printed on the wiring substrate 3 as shown in FIG. 3. The base substrate 40 is then turned upside down and the base substrate 40 and the wiring substrate 3 are joined as shown in FIG. 4.

Here, the printed part of the adhesive 51 is placed so as to avoid the electrode pad 17 which is a connection terminal of the wiring substrate 3. At the same time, the printed part of the adhesive 51 is placed such that it will not flow and spread to the electrode pad 17 when the TFT 13 is bonded. Furthermore, it is preferable to keep at least a 5 μm interval between the electrode pad 17 and an electrode pad 13a of the TFT 13 because the bump is built up by electroless plating and coupled later. For this reason, the adhesive 51 preferably contains a spacer such as a filler and a particle with a predetermined size.

In this embodiment, the pad 13a of the TFT 13 and the electrode pad 17 of the wiring substrate 3 are provided ten each in one chip and arranged in two lines. Each line includes five pads as shown in FIG. 16.

A size of the pad is 5-30 μm×5-30 μm and the interval between two adjacent pads is 10-25 μm. It is preferable to make the pad smaller in the horizontal direction or make a space between the pads since a bump later formed between the pads is isotropically grown.

Though the adhesive 51 is applied on the wiring substrate 3 by printing in this embodiment, other transfer methods such as dispensing and photolithography may be adopted.

Furthermore, though the adhesive 51 is applied in spots in an area other than where the electrode pad 17 is placed as shown in FIG. 16 in this embodiment, the adhesive 51 may be applied in lines in the area other than where the electrode pad 17 is placed as shown in FIG. 17. In other words, the adhesive 51 is applied so as to let a plating solution infiltrate among pads in a later final terminal coupling process. This means that the adhesive is applied in a way other than surrounding the circumference of the electrode pad 17. Though the adhesive 51 is a heat hardening type resin in this embodiment, other resins may be used. For example, an ultraviolet curing resin may be used.

After the base substrate 40 and the wiring substrate 3 are joined together, the adhesive 51 is hardened by applying heat and pressure and the TFT 13 is adhered and fixed on the wiring substrate 3. In this way, the TFT 13 and the wiring substrate 3 are mechanically coupled.

Figure 5:
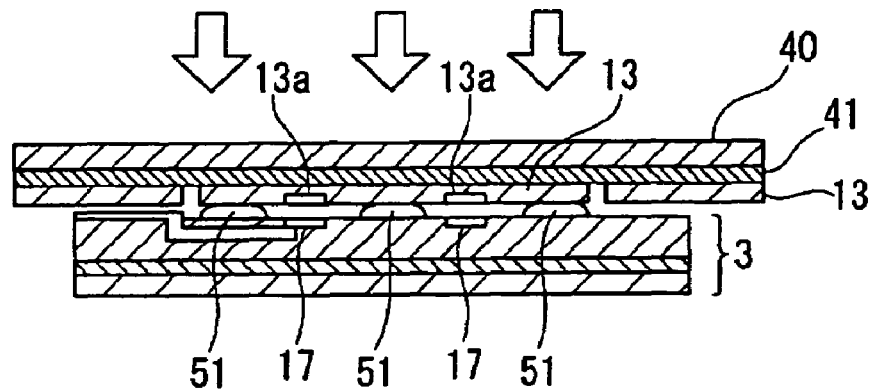

Next, the back side (the side where the TFT is not formed) of the base substrate is irradiated with a laser beam LA as shown in FIG. 5. With the irradiation, the bonds between atomic elements or molecules of the separation layer 41 get weakened while the hydrogen in the separation layer 41 molecularizes and separated from the crystal bond. In other words, a bonding force between the TFT 13 and the base substrate 4 is completely eliminated and this makes it possible to easily detach the TFT 13 in the irradiated area with the laser beam LA.

Figure 6:
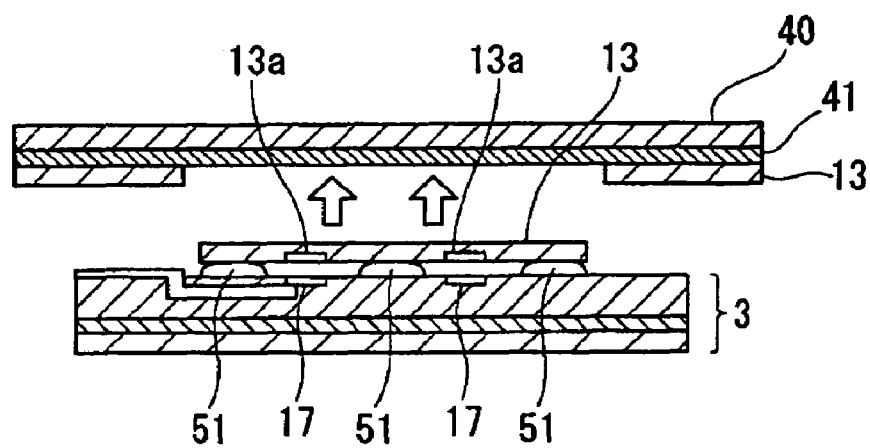

Next, the TFT 13 is removed from the base substrate 40 by separating the base substrate 40 from the wiring substrate 3 and the TFT 13 is transferred to the wiring substrate 3 at the same time as shown in FIG. 6. The electrode pad 13a of the TFT 13 is opposed to the electrode pad 17 of the wiring substrate 3 with a certain space therebetween.

Coupling Process of the Pad

Next, the bump is formed between the electrode pads 13a and 17 and these electrode pads 13a and 17 are electrically coupled with the bump.

First, these electrode pads 13a and 17 are soaked in a processing solvent in order to improve the wettability of the surface of the electrode pads 13a and 17 and to remove a residue. In this embodiment, the electrode pads are soaked in a solution containing 0.01-0.1% fluorinated acid and 0.01-0.1% sulfuric acid for 1-5 minutes. Alternatively, the electrode pads may be soaked in an alkali-based solution such as 0.1-10% sodium hydroxide solution for 1-10 minutes.

Next, the electrode pads are soaked in a solution which is alkaline pH 9-13, sodium hydroxide-base and heated to 20-60° C. for from 1 second to 5 minutes and an oxide film on the surface is removed. Alternatively, the electrode pads may be soaked in a solution which is acidic pH 1-3, 5-30% nitric acid-base and heated to 20-60° C. for from 1 second to 5 minutes.

Next, the electrode pads are soaked in a zincate solution which is pH 11-13 and includes ZnO for 1 second to 2 minutes and the surfaces of the pads are replaced with Zn. After this, the pads are soaked in a 5-30% nitric acid solution for 1-60 seconds and Zn is detached. Then, the pads are again soaked in the zincate solution for 1 second to 2 minutes and dense Zn particles are educed on the Al surface. Then, the pads are soaked in an electroless nickel plating bath and Ni plating is formed.

A thickness of the plating is about 2-10 μm. Hypophosphorous acid is contained as a reducing agent in the plaiting bath and the plaiting bath is pH 4-5 and heated to 80-95 ° C.

Figure 7:
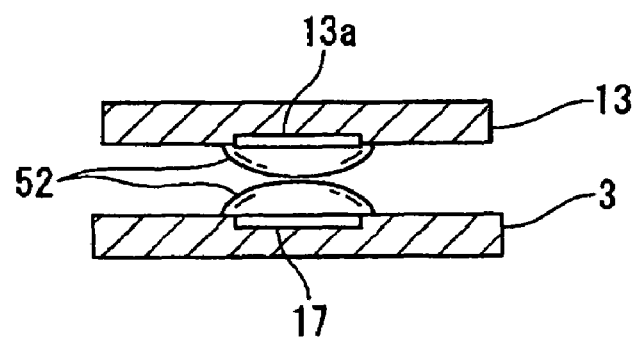

In the above-described process, phosphorus (P) is also educed as an eutectoid since the hypophosphorous acid bath is performed. The plating metal isotropically grows from both sides of the electrode pad 17 of the wiring substrate 3 and the electrode pad 13a of the TFT 13 as shown in FIG. 7. The plating metals on both electrode pads 13a and 17 respectively grows towards the half way line of the gap between electrode pads 13a and 17 and the plating metals are eventually jointed.

Figure 8:
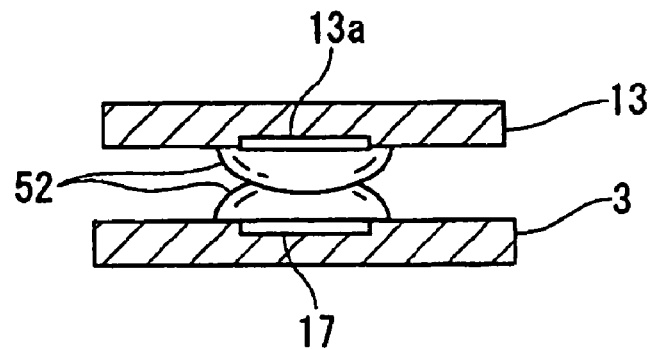
Figure 9:
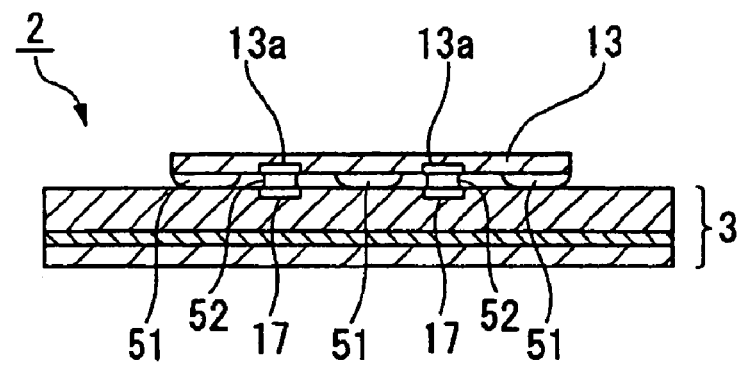

In order to increase a coupling area, the plating is continued for a certain period even after the plating metals are jointed as shown in FIG. 8.

After all the electrode pads 13a and 17 are coupled, the pads are soaked in a displacement Au plating bath and the Ni surface is lastly turned into Au. A layer of Au is formed in about 0.05-0.3 μm thick. The Au bath is performed for 1-30 minutes by using a cyanogen free type solution having pH 6-8 and heated to 50-80 ° C. In this way, a Ni—Au plating bump is formed on both electrode pads 13a and 17.

As described above, the electrode pads 13a and 17 are electrically coupled to each other through a bump 52 which is built up by the electroless plating.

Figure 10:
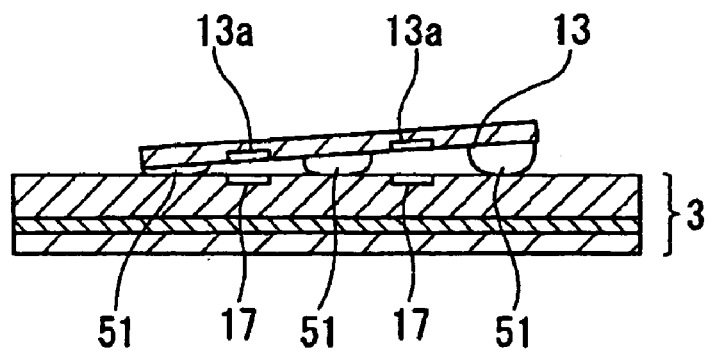
Figure 11:
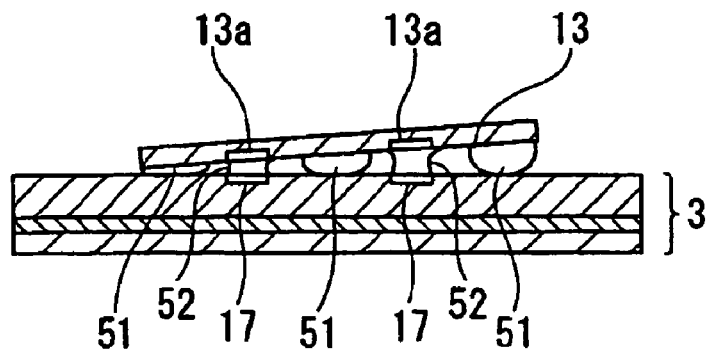

When electrode pads 13a and 17 are electrically coupled to each other in the above-described way, even if the bonding position of the TFT 13 and the wiring substrate 3 is slanted by a warp or step of the substrate and intervals between the electrode pads 13a and the electrode pads 17 become non-uniform as shown in FIG. 10, these pads can be certainly electrically coupled by depositing enough plating between the electrode pads 13a and 17 as shown in FIG. 11.

A water washing process is performed between each chemical treatment. A water washing tank has an overflow structure or Quick Dump and Rinse (QDR) structure and $N_2$ bubbling is conducted from the bottom face. In the bubbling, $N_2$ is released through holes on a tube made of Teflon (registered trademark) and the like or through a sintered body and the like. With the above-described process, an effective rinse can be performed in a short time.

Furthermore, after the electrode pads 13a and 17 are electrically coupled to each other through the bump 52, if the sealing paste is filled between the wiring substrate 3 and the TFT 13, the coupling position of the electrode pads 13a and 17 with the bump 52 can be steadily protected and the reliability of the connection can be enhanced.

Bonding Process of the Organic EL Substrate

Next, a process of ultimately forming the electrooptical device shown in FIG. 1 by joining the above-described wiring substrate 3 and the organic EL substrate 4 will be described with reference to FIGS. 12 through 14.

Figure 12:
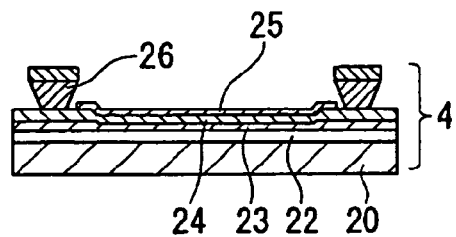

The organic EL substrate 4 has the anode 22, the hole injection/transport layer 23, the organic EL element 24 and the cathode 25 formed on the transparent substrate 20 in this order as shown in FIG. 12. The cathode 25 is formed after the cathode separator 26 was formed. Therefore, the cathode 25 is separated from the adjacent cathodes 25.

Figure 13:
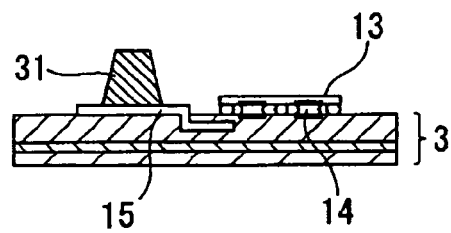

The conductive paste 31 is applied on the organic EL connection part 15 of the wiring substrate 3 as shown in FIG. 13. A silver paste is used as the conductive paste 31 in this embodiment.

Figure 14:
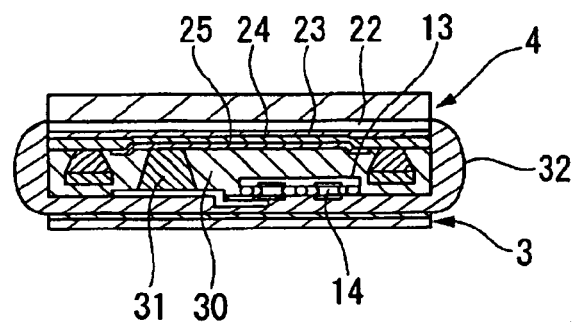

The organic EL substrate 4 is turned upside down and the organic EL substrate 4 and the wiring substrate 3 are joined such that the cathode 25 contacts with the conductive paste 31 as shown in FIG. 14. Then, the sealing paste 30 is filled in the space between both substrates and the periphery of both substrates is further sealed with a sealant 32. In this way, the electrooptical device 1 is completed.

The electrooptical device 1 has the cathode 25, the organic EL element 24, the hole injection/transport layer 23 and the anode 22 provided in this order from the wiring substrate 3 side of the organic EL substrate 4. Furthermore, the electrooptical device 1 is a top-emission type organic EL device in which the emitting light is taken out from the anode 22 side.

Conduction Check

In the above-described method of manufacturing the electrooptical device and the substrate joint body, conduction of the TFT 13 which is coupled to the wiring substrate 3 through the bump 52 was checked in the coupling process of the electrode pads 13a and 17. A fine conduciveness was confirmed and there was neither breakage nor damage to the TFT 13.

As described above, the bump 52 is respectively built up on the electrode pads 13a and 17 by the electroless plating and these bumps are electrically coupled to each other in this embodiment. Even if the accuracy of the bonding is poor such that the bonding position of the TFT 13 and the wiring substrate 3 is slanted by a warp or step of the substrate and intervals between the electrode pads 13a and the electrode pads 17 become non-uniform, these electrode pads can be certainly electrically coupled by depositing enough plating between the electrode pads 13a and 17 and making the bump 52 enlarge.

Therefore, the conduction between the TFT 13 and the wiring substrate 3 can be securely obtained without having trouble such as damaging or destroying the TFT 13 when the heat and pressure are raised in order to couple them.

Moreover, the space between the electrode pads 13a and 17 is steadily retained even when the TFT 13 is heated and pressed to the wiring substrate 3 because the adhesive 51 containing the spacer with a predetermined size is applied between the wiring substrate 3 and the TFT 13. Therefore, the bump 52 is credibly grown in the space between the electrode pads 13a and 17 and the electrode pads 13a and 17 can be electrically coupled to each other.

Furthermore, the adhesive 51 is placed such that it does not flow and spread to the electrode pads 13a and 17. This also helps the bump 52 credibly grow in the space between the electrode pads 13a and 17 and the electrode pads 13a and 17 can be electrically coupled to each other.

Moreover, when the bump 52 is formed between the electrode pads 13a and 17 so as not to short, trouble caused by shorting can be assuredly prevented.

Though the metal plating is deposited on both electrode pad 17 of the wiring substrate 3 and electrode pad 13a of the TFT 13, the metal plating may be deposited on only one of the electrode pads and the plating is grown to reach the other electrode pad in order to make the electric connection.

Second Embodiment of the Coupling Process of the Pad

Next, a second embodiment of the pad coupling process will be described.

The same structural members as those of the first embodiment are given identical numerals and those explanations will be omitted or simplified.

Figure 18:
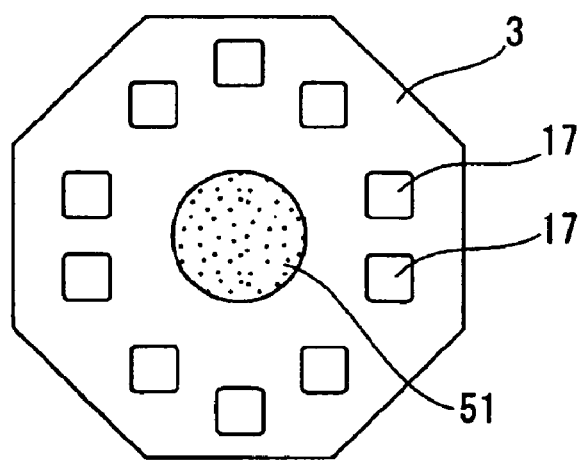
FIG. 18 is a plan view showing a substantial part of the wiring substrate according to a second embodiment of the present invention.
Figure 19:
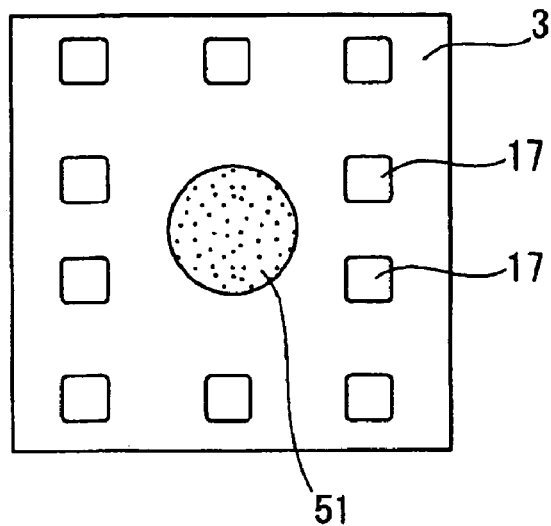
FIG. 19 is a plan view showing a substantial part of the wiring substrate according to a second embodiment of the present invention.
Figure 20:
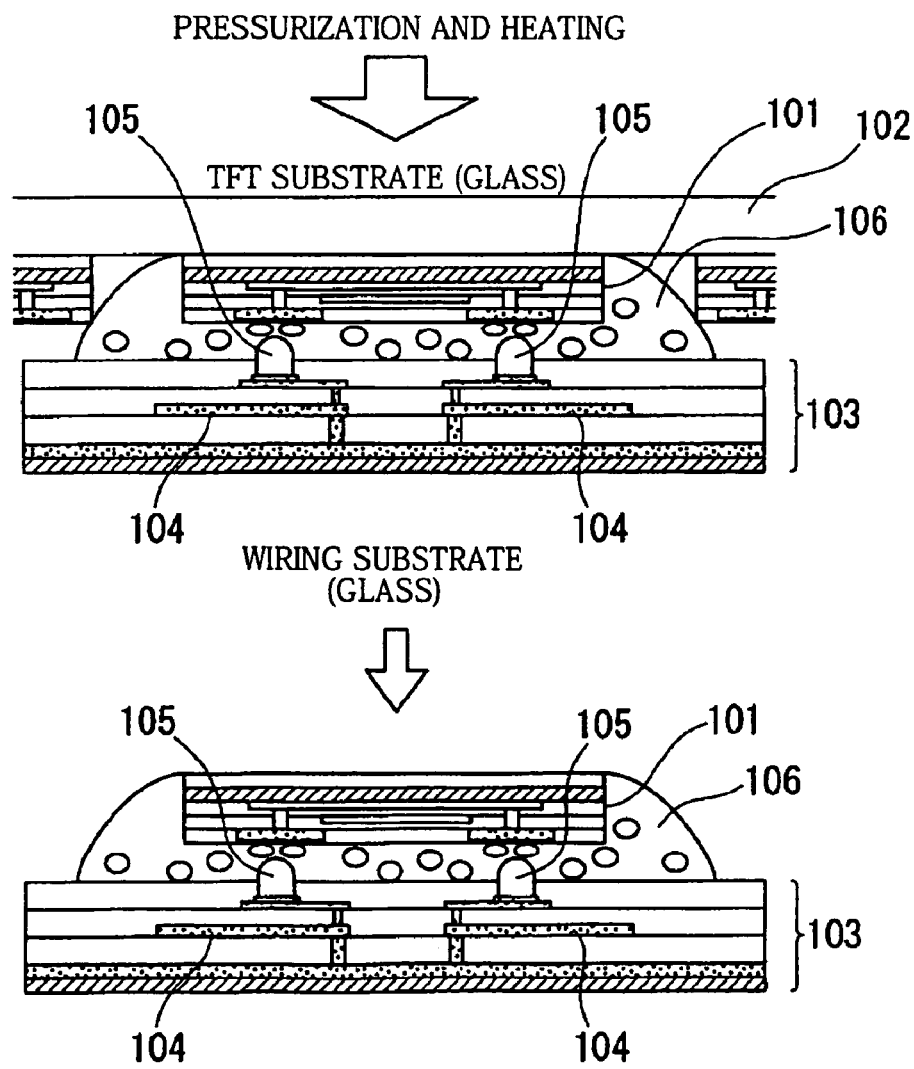
FIG. 20 is an explanatory drawing explaining a transfer technique.

The TFT 13 has a polygonal shape in plan as shown in FIG. 18 or a rectangular shape in plan as shown in FIG. 19. There are ten electrode pads 13a or 17 of the TFT 13 or the wiring substrate 3 per chip of the TFT 13 and they are annularly arranged in the periphery of the TFT 13 other than the center of the TFT 13. A size of the pad is 5-30 µm×5-30 µm and the interval between the adjacent two pads is 10-25 µm. It is preferable to make the electrode pads 13a and 17 smaller in the horizontal direction or have a space between adjacent pads since the bump 52 formed in the later process is isotropically grown. Moreover, Al is used as a main component of the electrode pads 13a and 17 in this embodiment.

The adhesive 51 is applied in the center of the TFT 13 on the wiring substrate 3. Though the adhesive 51 is applied to the center part of the location of the sequence of the electrode pad 17 in this embodiment, the adhesive 51 may be applied to other positions.

Next, the TFT 13 is joined to the wiring substrate 3 and the adhesive 51 is hardened by applying heat and pressure and the TFT 13 is adhered to the wiring substrate 3. Then, the separation layer 41 of the TFT 13 is broken down by an excimer laser and the TFT 13 is transferred.

Finally, the plating is performed to the electrode pad 17 in the wiring substrate 3 side and the electrode pad 13a in the TFT 13 side by electroless plating and the electrode pads 13a and 17 are electrically coupled through the bump 52. Other processes are the same as those of the above-described embodiment.

The TFT 13 coupled to the wiring substrate 3 in this way was confirmed to have a fine conduction and there were no damages or breakages in the TFT 13.

When the electrode pads 13a and 17 are annularly arranged as described above, a large amount of the adhesive 51 can be applied in the center and high adhesion can be secured when the TFT 13 is transferred to the wiring substrate 3. Moreover, the adhesive 51 can be printed in a large area even by the printing method which is difficult to transfer in a minute area. Furthermore, the electrode pads 13a and 17 placed the periphery of the mechanical connection part of the adhesive 51 can be certainly contacted with the plating solution and the electric connection by the electroless plating can be securely performed.

Third Embodiment of the Coupling Process of the Pad

Next, a third embodiment of the pad coupling process will be described.

In the above-described embodiment, the plating is conducted to the electrode pads 13a and 17 made of Al. In this embodiment, the plating metal is formed on Cu or a nitride film such as TiN. In the forming process, after the residue on the pad is removed by soaking in an organic or inorganic solution, a palladium (Pd) catalyst is applied to the pads only and they are activated. Then, the pads are soaked in the electroless nickel plating bath and the Ni plating is formed.

The TFT 13 coupled to the wiring substrate 3 in this way was confirmed to have a fine conduction and there were no damages or breakages in the TFT 13.

What is claimed is:

1. An electrooptical device having a switching element that drives a light emitting element and is mounted on a wiring substrate, comprising:
    an electrode pad of the wiring substrate and an electrode pad of the switching element arranged at a predetermined interval and mechanically coupled with an adhesive containing a spacer having a filler and a particle with a predetermined size; and
    a bump grown from at least one of the electrode pad of the wiring substrate and the electrode pad of the switching element, wherein the wiring substrate and the switching element are mechanically coupled and the wiring substrate and the switching element are electrically coupled through the bump and wherein the electrode pads are annularly arranged so as to surround the mechanical coupling part of the wiring substrate and the switching element;
    wherein the bump is grown by soaking the electrode pad of the wiring substrate and the electrode pad of the switching element in a solution to remove residue on the electrode pad of the wiring substrate and the electrode pad of the switching element, by activating the electrode pad of the wiring substrate and the electrode pad of the switching element by applying a catalyst to the electrode pad of the wiring substrate and the electrode pad of the switching element, and by soaking the electrode pad of the wiring substrate and the electrode pad of the switching element in an electroless nickel plating bath.

2. A method of manufacturing a substrate joint body by mounting an electric element on a wiring substrate, comprising:
    arranging an electrode pad of the wiring substrate and an electrode pad of the electric element at a predetermined interval and mechanically coupling the wiring substrate and the electric element;
    soaking the electrode pad of the wiring substrate and the electrode pad of the electric element in a solution to remove residue on the electrode pad of the wiring substrate and the electrode pad of the electric element;
    activating the electrode pad of the wiring substrate and the electrode pad of the electric element by applying a catalyst to the electrode pad of the wiring substrate and the electrode pad of the electric element; and
    electrically coupling the wiring substrate and the electric element by growing a bump from at least one of the electrode pad of the wiring substrate and the electrode pad of the electric element, the growing the bump including soaking the electrode pad of the wiring substrate and the electrode pad of the electric element in an electroless nickel plating bath;
    wherein the wiring substrate and the electric element are mechanically coupled by applying an adhesive containing a spacer, the spacer having a filler and a particle with a predetermined size, between the wiring substrate and the electric element and wherein the electrode pads are annularly arranged so as to surround the mechanical coupling part of the wiring substrate and the electric element.

3. The method of manufacturing a substrate joint body according to claim 2, wherein the electrode pad of the wiring substrate and the electrode pad of the electric element are formed to have a size with which the bump is securely placed adjacent to the electrode pads without causing short-circuiting when the wiring substrate and the electric element are electrically coupled.

4. The method of manufacturing a substrate joint body according to claim 2, further comprising:

filling a sealant between the wiring substrate and the electric element after the wiring substrate and the electric element are electrically coupled.

5. A substrate joint body manufactured by the method of manufacturing a substrate joint body according to claim 2.

6. A method of manufacturing a substrate joint body by mounting an electric element on a wiring substrate, comprising:

arranging an electrode pad of the wiring substrate and an electrode pad of the electric element at a predetermined interval and mechanically coupling the wiring substrate and the electric element;

soaking the electrode pad of the wiring substrate and the electrode pad of the electric element in a solution to remove residue on the electrode pad of the wiring substrate and the electrode pad of the electric element;

activating the electrode pad of the wiring substrate and the electrode pad of the electric element by applying a catalyst to the electrode pad of the wiring substrate and the electrode pad of the electric element; and electrically coupling the wiring substrate and the electric element by growing a bump from at least one of the electrode pad of the wiring substrate and the electrode pad of the electric element, the growing the bump including soaking the electrode pad of the wiring substrate and the electrode pad of the electric element in an electroless nickel plating bath;

wherein the wiring substrate and the electric element are mechanically coupled by applying an adhesive containing a spacer having a predetermined interval between the wiring substrate and the electric element, the spacer having a filler and a particle with a predetermined size;

wherein the adhesive is applied such that the adhesive is prevented from spreading to the electrode pad when the electrode pad of the wiring substrate and the electrode pad of the electric element are arranged at the predetermined interval; and wherein the electrode pads are annularly arranged so as to surround the mechanical coupling part of the wiring substrate and the electric element.

7. The method of manufacturing a substrate joint body according to claim 6, wherein the electrode pad of the wiring substrate and the electrode pad of the electric element are formed to have a size with which the bump is securely placed adjacent to the electrode pads without causing short-circuiting when the wiring substrate and the electric element are electrically coupled.

8. The method of manufacturing a substrate joint body according to claim 6, further comprising:

filling a sealant between the wiring substrate and the electric element after the wiring substrate and the electric element are electrically coupled.

9. A substrate joint body manufactured by the method of manufacturing a substrate joint body according to claim 6.

10. A substrate joint body manufactured by a method of manufacturing a substrate joint body by mounting an electric element on a wiring substrate, the method comprising:

arranging an electrode pad of the wiring substrate and an electrode pad of the electric element at a predetermined interval and mechanically coupling the wiring substrate and the electric element by applying an adhesive containing a spacer having a filler and a particle with a predetermined size;

soaking the electrode pad of the wiring substrate and the electrode pad of the electric element in a solution to remove residue on the electrode pad of the wiring substrate and the electrode pad of the electric element;

activating the electrode pad of the wiring substrate and the electrode pad of the electric element by applying a catalyst to the electrode pad of the wiring substrate and the electrode pad of the electric element; and electrically coupling the wiring substrate and the electric element by growing a bump from at least one of the electrode pad of the wiring substrate and the electrode pad of the electric element, the growing the bump including soaking the electrode pad of the wiring substrate and the electrode pad of the electric element in an electroless nickel plating bath;

wherein the electrode pads are annularly arranged so as to surround the mechanical coupling part of the wiring substrate and the electric element.

* * * * *